(12) United States Patent
Kuo et al.

(10) Patent No.: US 11,075,242 B2
(45) Date of Patent: Jul. 27, 2021

(54) SEMICONDUCTOR DEVICES FOR IMAGE SENSING

(71) Applicant: Taiwan Semiconductor Manufacturing Co., Ltd., Hsin-Chu (TW)

(72) Inventors: Chin-Chia Kuo, Tainan (TW); Jhy-Jyi Sze, Hsin-Chu (TW); Tung-Ting Wu, Taipei (TW); Yimin Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/962,130

(22) Filed: Apr. 25, 2018

(65) Prior Publication Data

US 2019/0165026 A1 May 30, 2019

Related U.S. Application Data

(60) Provisional application No. 62/590,864, filed on Nov. 27, 2017.

(51) Int. Cl.
*H01L 27/146* (2006.01)
*H01L 31/0236* (2006.01)
*H01L 31/0232* (2014.01)

(52) U.S. Cl.
CPC .... *H01L 27/14629* (2013.01); *H01L 27/1462* (2013.01); *H01L 27/1463* (2013.01);
(Continued)

(58) Field of Classification Search
CPC ......... H01L 27/14629; H01L 31/02327; H01L 27/1463; H01L 27/1462; H01L 31/02363;
(Continued)

(56) References Cited

U.S. PATENT DOCUMENTS 7,061,106 B2 6/2006 Yang
7,446,359 B2 11/2008 Lee
(Continued)

FOREIGN PATENT DOCUMENTS

CN 105428379 A 3/2016

OTHER PUBLICATIONS

U.S. Appl. No. 15/688,077, filed on Aug. 28, 2017.
(Continued)

*Primary Examiner* — Hoang-Quan Ho
(74) *Attorney, Agent, or Firm* — Eschweiler & Potashnik, LLC (57) ABSTRACT

The present disclosure relates to a semiconductor device having a lateral resonance structure to coherently reflect light toward the image sensor. The semiconductor device includes an image sensing element arranged within a substrate. A radiation absorption region is arranged within the substrate and above the image sensor, and contains an array of protrusions having a characteristic dimension and an outer border. A resonant structure containing a plurality of deep trench isolation (DTI) structures is disposed on opposing sides of the image sensing element. The (DTI) structures surround the outer border of the array of protrusions. An inner surface of the DTI structure is laterally spaced apart from the outer border of the array of protrusions by a reflective length based on the characteristic dimension of the array of protrusions, thus affecting coherent reflection of light back toward the image sensor.

20 Claims, 9 Drawing Sheets

(52) U.S. Cl.
CPC .... *H01L 27/1464* (2013.01); *H01L 27/14607* (2013.01); *H01L 27/14685* (2013.01); *H01L 31/02327* (2013.01); *H01L 31/02363* (2013.01)

(58) Field of Classification Search
CPC .......... H01L 27/1464; H01L 27/14685; H01L 27/14607; H01L 27/14625
See application file for complete search history.

(56) References Cited

U.S. PATENT DOCUMENTS

| | | | |
|---|---|---|---|
| 10,079,259 B2 | 9/2018 | Yu et al. | |
| 10,134,801 B2 | 11/2018 | Lu et al. | |
| 10,134,926 B2 | 11/2018 | Akkaya | |
| 10,157,946 B2 | 12/2018 | Tu et al. | |
| 10,672,817 B2 | 6/2020 | Lee | |
| 2009/0283807 A1 | 11/2009 | Adkisson et al. | |
| 2015/0221692 A1 | 8/2015 | Enomoto et al. | |
| 2016/0112614 A1* | 4/2016 | Masuda | H01L 31/10 348/374 |
| 2017/0040357 A1 | 2/2017 | Yu | |
| 2017/0047367 A1 | 2/2017 | Lee et al. | |
| 2018/0151759 A1* | 5/2018 | Huang | H01L 27/14603 |
| 2018/0359434 A1* | 12/2018 | Tanaka | G02B 1/118 |

OTHER PUBLICATIONS

Notice of Allowance dated Apr. 17, 2019 in connection with U.S. Appl. No. 15/688,077.
Non-Final Office Action dated Sep. 29, 2020 in connection with U.S. Appl. No. 16/405,132.
Notice of Allowance dated Jan. 7, 2021 in connection with U.S. Appl. No. 16/405,132.

* cited by examiner

SEMICONDUCTOR DEVICES FOR IMAGE SENSING

REFERENCE TO RELATED APPLICATION

This Application claims priority to U.S. Provisional Application No. 62/590,864 filed on Nov. 27, 2017, the contents of which are hereby incorporated by reference in their entirety.

BACKGROUND

Integrated circuits (IC) with image sensors are used in a wide range of modern day electronic devices. In recent years, complementary metal-oxide semiconductor (CMOS) image sensors have begun to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors generally comprise a plurality of pixel regions respectively having an image sensing element. Over time, the semiconductor industry has reduced a size of pixel regions, so as to increase a number of pixel regions in a CMOS image sensor (CIS) integrated chip. Increasing the number of pixel regions in a CIS integrated chip increases the resolution of an image captured by the CIS integrated chip. However, as the size of the pixel regions gets smaller, the pixel regions come closer together and crosstalk between adjacent pixel regions increases.

Crosstalk occurs when incident light directed towards one pixel region is undesirably sensed by another pixel region, thereby degrading a quality of an image captured by a CIS integrated chip. It has been appreciated that intervening layers arranged between a color filter and an image sensing element may increase crosstalk between adjacent pixel regions. This is because when adjacent intervening layers have different indices of refraction, the layers may refract (i.e., change in a direction of propagation of a light wave) an incident light ray according to Fresnel's equation. Furthermore, if an interface between adjacent intervening layers is not planar, refracted light may be even more likely to travel in a lateral direction and increase cross-talk.

The present disclosure relates to a semiconductor device having a deep trench isolation (DTI) structure having a textured lateral 2D resonance structure to improve quantum efficiency (QE) and modulation transfer function (MTF). The resonance structure is laterally spaced apart from an outer border of the radiation absorption region by a reflective length, the spacing affecting coherent reflection of light toward the image sensor and improving QE and MTF performance. In such a configuration, the resonant structure reflects light back toward the image sensor that may have normally become incident on an adjacent sensor absent the resonant structure. Thus, unintended cross-talk is reduced, and MTF and QE are similarly increased.

In some embodiments, a semiconductor device is configured to detect electromagnetic radiation, and comprises an image sensing element arranged within a substrate. A radiation absorption region comprising an array of protrusions is arranged along a first side of the substrate over the image sensing element. The array of protrusions have a characteristic dimension and an outer border. A deep trench isolation (DTI) structure surrounds the outer border of the array of protrusions and extends from the first side of the substrate to within the substrate. An inner surface of the DTI structure is laterally spaced apart from the outer border of the array of protrusions by a reflective length that is based on the characteristic dimension of the array of protrusions. By reflecting electromagnetic radiation using the DTI structure, which is located at the reflective length, cross-talk between adjacent pixel regions is reduced, and the radiation is reflected more coherent thereby improving the MTF and the QE of the image sensor integrated chip.

Figure 1:
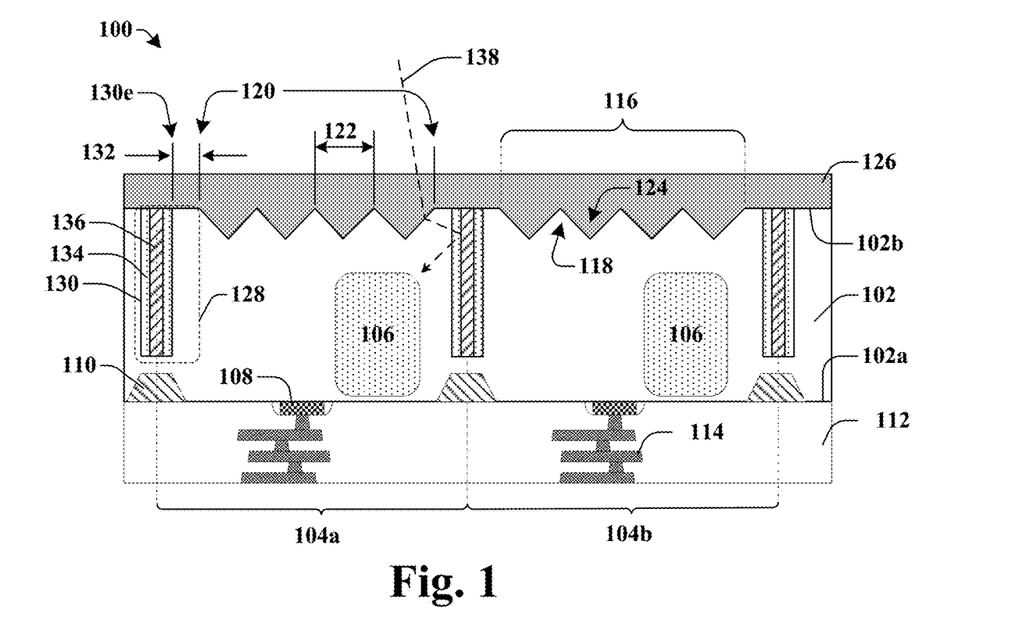
FIG. 1 illustrates a cross-sectional view of some embodiments of an image sensor integrated chip having a textured lateral 2D resonance structure to improve quantum efficiency (QE) and modulation transfer function (MTF). The resonance structure comprises a deep trench isolation (DTI) structure laterally spaced apart from an outer border of the radiation absorption region by a reflective length, the spacing enhancing coherent reflection of light toward the image sensor and improving QE and MTF performance.

FIG. 1 illustrates a cross-sectional view of some embodiments of a semiconductor device 100 comprising a resonant structure configured to reduce cross-talk between pixel regions.

The semiconductor device 100 comprises a substrate 102 having a plurality of pixel regions 104a-104b. The plurality of pixel regions 104a-104b respectively comprise an image sensing element 106 configured to convert incident radiation (e.g., photons) into an electric signal (i.e., to generate electron-hole pairs from the incident radiation). In some embodiments, the image sensing element 106 may comprise a photodiode.

A plurality of transistor devices 108 are arranged along a front-side 102a of the substrate 102. In some embodiments, the transistor devices 108 arranged within respective pixel regions 104a-104b may be separated by shallow trench isolation (STI) structures 110 within the front-side 102a of the substrate 102. A dielectric structure 112 is also arranged along the front-side 102a of the substrate 102. The dielectric structure 112 surrounds a plurality of conductive interconnect layers 114. In some embodiments, the dielectric structure 112 comprises a plurality of stacked inter-level dielectric (ILD) layers, and the plurality of conductive interconnect layers 114 comprise alternating layers of conductive vias and conductive wires, which are arranged within the stacked ILD layers and electrically coupled to the plurality of transistor devices 108.

A back-side 102b of the substrate 102 comprises a radiation absorption region 116 characterized by a non-planar surface defining an array of protrusions 118 arranged in a periodic pattern, and having an outer border 120 and a characteristic dimension 122. The array of protrusions 118 is laterally separated by an array of recesses 124 within the back-side 102b of the substrate 102. In some embodiments, the array of protrusions 118 may comprise a number of individual protrusions 202 (see FIG. 2A) of periodically repeating shapes. The individual protrusions may have sidewalls configured to comprise cone shapes having a peak, or may have substantially planar triangularly-shaped sidewalls configured to form a peak and collectively to form pyramidal structures, or may have other easily produced shapes using semiconductor fabrication techniques. For example, the sides of the pyramidal shapes may be substantially planar, convex, or concave.

In some embodiments, the characteristic dimension 122 is a spacing between repeating features among the individual protrusions 202 within the array of protrusions 118. In some embodiments, the characteristic dimension comprises a pitch distance 122a defined by the spacing between nearest peaks of the individual protrusions 202. The array of protrusions 118 are further configured within the radiation absorption region 116 which is confined within the plan view of a pixel region such as pixel region 104a. The array of protrusions 118 further comprises an outer border 120. In some embodiments, the outer border 120 comprises linked segments aligned with the sides of pyramidal structures located on the exterior of the array of protrusions 118.

One or more absorption enhancement layers 126 are arranged over the plurality of protrusions 118 and within the recesses 124. One of the one or more absorption enhancement layers 126 contacts the substrate 102 along the non-planar surface to define an absorption enhancement structure with a topography that increases absorption of radiation by the substrate 102 (e.g., by reducing a reflection of radiation from the non-planar surface). Increasing absorption of radiation by the substrate 102 increases a quantum efficiency (QE) of the image sensing element 106, and thereby improves performance of the image sensor integrated chip 100.

The plurality of pixel regions 104a-104b are separated by resonant structures 128 laterally disposed on opposing sides of the image sensor element 106 and extending from the back-side 102b of the substrate 102 into the substrate 102. A plurality of deep trench isolation (DTI) structures 130 are arranged within the resonant structures and configured to provide for electrical isolation between adjacent ones of the plurality of pixel regions 104a-104b.

The DTI structures 130 surround the outer border 120 of the array of protrusions 118. The inner surface of the DTI structures 130 is laterally spaced apart from the outer border 120 of the array of protrusions 118 by a reflective length 132. The reflective length is determined by a relation between a characteristic dimension 122 of the array of protrusions 118 and the one or more wavelengths of radiation that the radiation absorption region 116 is configured to absorb. By implementing the reflective length 132 spacing between the inner surfaces 130e of the DTI structures 130 and the outer border 120 of the array of protrusions 118, light that is incident upon the DTI structures 130 is more likely to be coherently reflected back toward the image sensor element 106, thus improving the sensor's performance.

The DTI structures 130 comprises one or more dielectric materials 134 lining interior surfaces of the DTI structures 130. In some embodiments, the dielectric materials 134 may also line (not shown) an interface between the array of protrusions 118 and the absorption enhancement layers 126. In some embodiments, the one or more dielectric materials 134 may comprise a same dielectric material as the one or more absorption enhancement layers 126. In other embodiments, the one or more dielectric materials 134 may comprise different dielectric materials than the one or more absorption enhancement layers 126.

In some embodiments, the DTI structures 130 may also comprise a reflective element 136 having one or more reflective regions configured to reflect electromagnetic radiation. Because the reflective element 136 is configured to reflect electromagnetic radiation, the reflective element 136 reduces cross-talk between adjacent pixel regions 104a-104b. For example, when incident radiation 138 directed towards a first pixel region 104a strikes an interface between the one or more absorption enhancement layers 126 and the substrate 102, a portion of the incident radiation 138 may be refracted towards the second pixel region 104b. The reflective element 136 is configured to coherently reflect the portion of the incident radiation 138 back toward the first pixel region 104a, thereby reducing cross-talk and further increasing a quantum efficiency of the image sensor integrated chip 100. In some embodiments, the reflective element 136 can be polysilicon or a metal, such as copper, aluminum, or tungsten, for example.

It will be appreciated that, in some embodiments, the front-side 102a of the substrate 102 may be referred to as a "first side" of the substrate, and the backside 102b of the substrate 102 may be referred to as a "second side" of the substrate. However, in other embodiments the back-side 102b of the substrate 102 may be referred to as a "first side" of the substrate, and the front-side 102a may be referred to as a "second side" of the substrate. Thus, "first" and "second" are merely generic identifiers in this regard, and do not imply any particular order or structural relationship with regards to the various features.

Figure 2A:
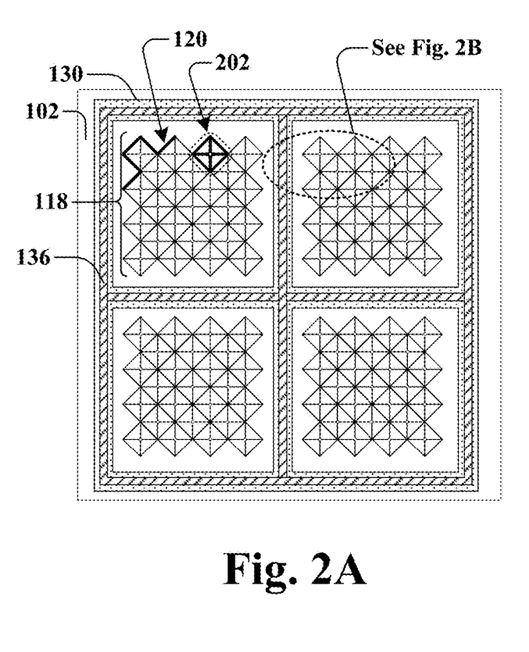
FIGS. 2A-2B illustrate plan views of additional embodiments of the configuration of the radiation absorption region and the resonant structure for an image sensor integrated chip having a textured lateral 2D resonance structure to improve image sensing.
Figure 2B:
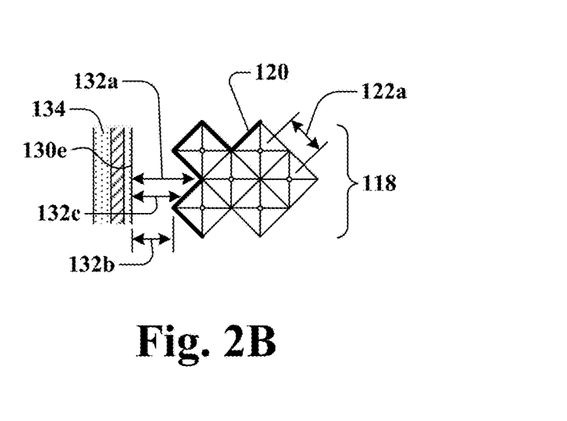

FIGS. 2A-2B illustrate plan views of additional embodiments of the configuration of the radiation absorption region 116 and the resonant structure 128 for a semiconductor device having a textured lateral 2D resonance structure to improve image sensing. FIG. 2A illustrates a plan view of a grouping of several adjacent pixel regions showing the array of protrusions 118 within the outer border 120 (depicted by the heavy line). As illustrated, a DTI structure manifest as a plurality of ring-shaped deep trench isolation (DTI) structures 130, which abut one another to establish a mesh or grid. Each array of protrusions 118 has its outer border 120 surrounded by a ring-shaped DTI structure 130.

While the outer border 120 is illustrated as being composed of a series of linear segments lining the exterior boundary of pyramidal-shaped individual protrusions 202, there is no such general restriction to the shape of the outer border 120. In some embodiments, the outer border may follow curvilinear or continuous shapes as appropriate to surround exterior surfaces of individual protrusions that may be shaped in a variety of forms. As illustrated, the DTI structures 130 surround the outer border 120 of the array of protrusions 118. The DTI structures 130 may further comprise reflective elements 136.

FIG. 2B illustrates a plan view of further embodiments of the configuration of the array of protrusions 118 relative to the DTI structures 130. The reflective length 132 may be a variable distance measured laterally between the inner surface 130e of the DTI structures 130 and the outer border 120 of the array of protrusions 118, and may vary with the shape of the outer border 120. For example, the reflective length 132 may be as long as the dimension depicted as 132a which represents a lateral distance between the inner surface 130e of the DTI structures 130 and a furthermost point of the outer border 120. Similarly, the reflective length 132 may be as short as the dimension depicted as 132b which represents a lateral distance between the inner surface 130e of the DTI structures 130 and a nearest point of the outer border 120. Additionally, the reflective length 132 may be a dimension in between the minimum 132a and maximum 132b dimensions noted as depicted as 132c.

Figure 2C:
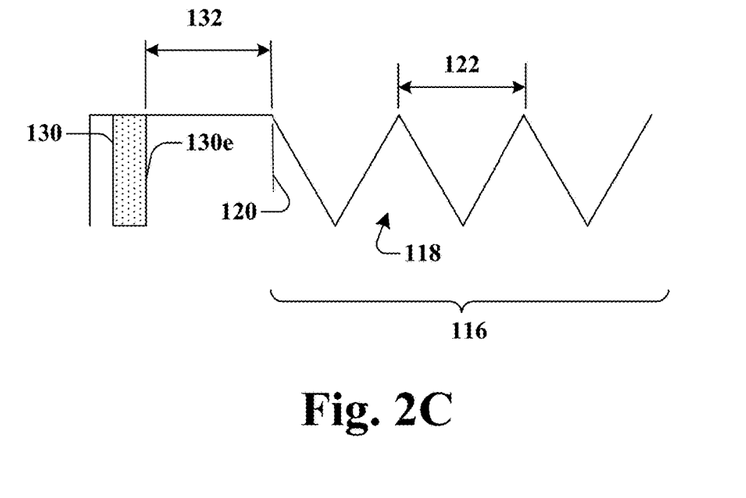
FIG. 2C illustrates an enlarged cross-sectional view of some embodiments of an image sensor integrated chip.

FIG. 2C illustrates a cross-sectional view relating the reflective length 132 to the characteristic dimension 122 of the array of protrusions 118 within the radiation absorption region 116. As discussed above, the reflective length 132 may vary depending on the variation in lateral distance between the inner surface 130e of the DTI structures 130 and the outer border 120 of the array of protrusions 118. Additionally, the reflective length 132 is determined such that radiation incident on the DTI structures 130 is reflected toward the image sensor element 106 with a level of coherence thus improving the MTF and the QE of the image sensor element 106. In some embodiments, the reflective length 132 is found to be advantageously less or equal to about three (3) times the characteristic dimension 122 of the array of protrusions, which may be the pitch distance 122a. In some embodiments, the reflective length 132 is found to be advantageously less than or equal to about $3\sqrt{2}/2$ multiplied by the pitch distance 122a. In some embodiments, for example as applied to near infrared (NIR) sensors, the reflective length 132 may advantageously be less than or equal to about 636 nm with a pitch distance of about 0.3 μm.

Figure 3:
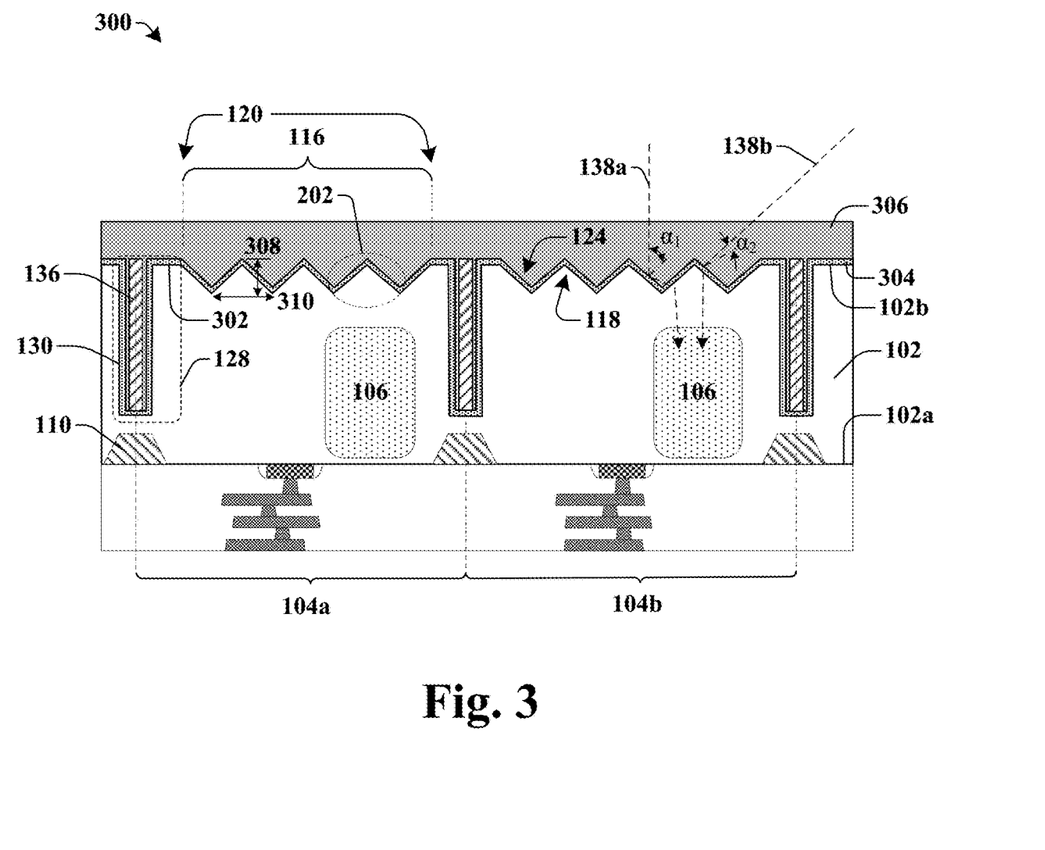
FIG. 3 illustrates a cross-sectional view of additional embodiments of an image sensor integrated chip having a textured lateral 2D resonance structure to improve quantum efficiency (QE) and modulation transfer function (MTF).

FIG. 3 illustrates some additional embodiments of a cross-sectional view of a semiconductor device 300 having a textured lateral 2D resonance structure to improve quantum efficiency (QE) and modulation transfer function (MTF) in image sensing devices. The semiconductor device 300 comprises a substrate 102 having a plurality of pixel regions 104a-104b respectively comprising an image sensing element 106. An array of protrusions 118 are arranged within a back-side 102b of the substrate 102. The array of protrusions 118 comprises a periodic pattern of repeating individual protrusions 202 separated from one another by an array of recesses 124 defined by sidewalls of the individual protrusions 202. The array of protrusions 118 is confined within the radiation absorption region 116, and has an outer border 120. The repeating shapes of the individual protrusions 202 give rise to a characteristic dimension 122 (see FIG. 2C) associated with the array of protrusions 118. In some embodiments, the characteristic dimension 122 is a spacing between repeating features among the individual protrusions 202 within the array of protrusions 118. In some embodiments, the characteristic dimension 122 comprises a pitch distance 122a defined by the spacing between nearest peaks of the individual protrusions 202. In some embodiments, the sidewalls of the individual protrusions may comprise cones, conical cylinders, or pyramids (e.g., having an n-sided base, wherein n=3, 4, 5, 6, . . . ). In some embodiments, the individual protrusions may have sidewalls that meet at a pinnacle or a peak.

The array of protrusions 118 may have a height 308 and a width 310 (measured along the largest dimensions of an individual protrusion 202). In some embodiments for example, as applied to near infrared (NIR) sensors, the height 308 may be in a range of between approximately 300 nm and approximately 650 nm and the width 310 may be in a range of between approximately 400 nm and approximately 900 nm. In other embodiments, the height 308 may be less than approximately 300 nm and the width 310 may be less than approximately 400 nm.

The plurality of pixel regions 104a-104b are bordered by resonant structures 128, which contain DTI structures 130 extending into the back-side 102b of the substrate 102 to a depth that is greater than that of the array of recesses 124. In some embodiments, the DTI structures 130 may be arranged within horizontally extending surfaces 302 extending between adjacent ones of the pixel regions 104a-104b. The DTI structures 130 are laterally spaced apart from the outer border 120 of the array of protrusions by a reflective length 132. The reflective length 132 is determined by a relation between a characteristic dimension 122 of the array of protrusions 118 and the one or more wavelengths of radiation that the radiation absorption region 116 is configured to absorb. Additionally, the reflective length 132 is determined such that radiation incident on the DTI structures 130 is reflected toward the image sensor element 106 with a level of coherence thus improving the MTF and the QE of the image sensor element 106. In some embodiments, the reflective length 132 is found to be advantageously less or equal to about three (3) times the characteristic dimension 122 of the array of protrusions, which may be the pitch distance 122a. In some embodiments, the reflective length is found to be advantageously less than or equal to about $3\sqrt{2}/2$ multiplied by the pitch distance 122a.

One or more absorption enhancement layers 304-306 are arranged along the back-side 102b of the substrate 102 within the plurality of recesses 124 and within the DTI structures 130. The plurality of protrusions 118 and the one or more absorption enhancement layers 304-306 are configured to increase absorption of radiation by the image sensing element 106 by providing for a low reflection of radiation from the substrate 102 (e.g., a reflection of less than or equal to approximately 5% for radiation having a wavelength of between approximately 700 nm and approximately 2500 nm). For example, for incident radiation 138a having an angle of incidence $\alpha_1$ greater than a critical angle, angled sidewalls of the protrusions may act to reflect the incident radiation 138a to within the recesses 124, where the incident radiation 138a can be subsequently absorbed into the substrate 102. The angled sidewalls of the protrusions 118 may further act to reduce an angle of incidence $\alpha_2$ for incident radiation 138b having a steep angle with respect to a top surface of the one or more absorption enhancement layers 304-306, thereby preventing the incident radiation 138b from reflecting away from the substrate 102.

In some embodiments, the one or more absorption enhancement layers 304-306 may comprise an anti-reflective layer 304 and a layer of dielectric material 306 over the anti-reflective layer 304. The anti-reflective layer 304 lines the back-side 102b of the substrate 102 and may line interior surfaces of the DTI structures 130. The layer of dielectric material 306 is separated from the substrate 102 by the anti-reflective layer 304. In some embodiments, the anti-reflective layer 304 may comprise a high-k dielectric material and the layer of dielectric material 306 may comprise an oxide (e.g., $SiO_2$).

Within the DTI structures, the anti-reflective layer 304 and the layer of dielectric material 306 surround a reflective element 136 configured to reflect one or more wavelengths of electromagnetic radiation toward the image sensor element 106. The anti-reflective layer 304 and the dielectric material 306 separate the reflective element 136 from the substrate 102. The reflective element 136 may comprise one or more reflective regions. The one or more reflective regions may comprise materials selected to provide for a good QE at different wavelengths of electromagnetic radiation. In some embodiments, the one or more reflective regions may comprise one or more reflective filler materials. The one or more reflective filler materials may comprise metals such as aluminum (Al), rhodium (Rh), ruthenium (Ru), copper (Cu), silver (Ag), gold (Au), tungsten (W), cobalt (Co), iron (Fe), molybdenum (Mo), titanium (Ti), chromium (Cr). For example, a first reflective region may comprise aluminum and an adjacent reflective region may comprise tungsten. In other embodiments, one of the one or more reflective regions may comprise an air gap filled with a gas (e.g., oxygen, nitrogen, etc.).

Figure 4:
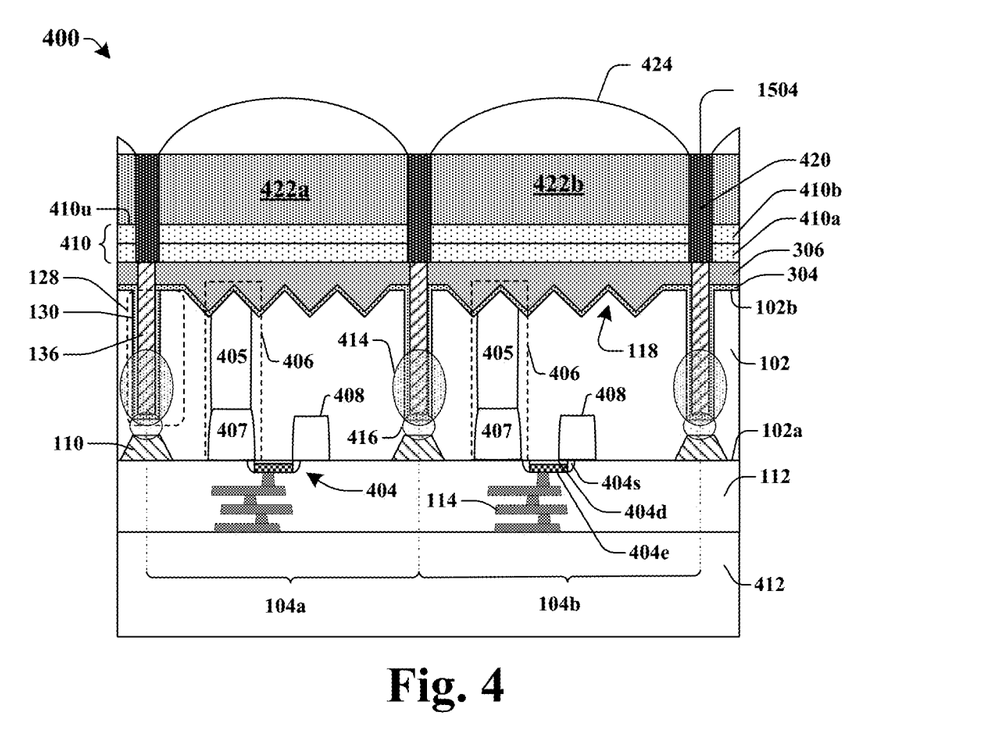
FIG. 4 illustrates a cross-sectional view of additional embodiments of a back-side CMOS image sensor (BSI-CIS) having a textured lateral 2D resonance structure to improve quantum efficiency (QE) and modulation transfer function (MTF).

FIG. 4 illustrates a cross-sectional view of some embodiments of a back-side illuminated CMOS image sensor (BSI-CIS) integrated chip 400 having a textured lateral 2D resonance structure to improve quantum efficiency (QE) and modulation transfer function (MTF) in image sensing devices. Although FIG. 4 describes BSI-CIS, it will be appreciated that the disclosed back-side deep trench isolation (BDTI) structure may also be used with FSI image sensors.

The BSI-CIS integrated chip 400 comprises a plurality of transistor gate structures 404 arranged along a front-side 102a of a substrate 102. The plurality of transistor gate structures 404 respectively comprise a gate dielectric layer 404d disposed along the front-side 102a of the substrate 102 and a gate electrode 404e arranged on the gate dielectric layer 404d. In some embodiments, sidewall spacers 404s are arranged on opposing sides of the gate electrode 404e.

In some embodiments, a transistor gate structure 404 corresponds to a transfer transistor laterally arranged between a photodiode 406 and a floating diffusion well 408 within the substrate 102. In such embodiments, the photodiode 406 may comprise a first region 405 having a first doping type (e.g., n-type doping) and an adjoining second region 407 within the substrate 102 having a second doping type (e.g., p-type doping) that is different than the first doping type. The transistor gate structure 404 is configured to control the transfer of charge from the photodiode 406 to the floating diffusion well 408. If a charge level is sufficiently high within the floating diffusion well 408, a source-follower transistor (not shown) is activated and charges are selectively output according to operation of a row select transistor (not shown) used for addressing. A reset transistor (not shown) is configured to reset the photodiode 406 between exposure periods.

A dielectric structure 112 is also arranged along the front-side 102a of the substrate 102. The dielectric structure 112 may comprise a plurality of stacked inter-level dielectric (ILD) layers. In various embodiments, the plurality of stacked inter-level dielectric (ILD) layers may comprise one or more of an oxide (e.g., $SiO_2$, SiCO, etc.), a fluorosilicate glass, a phosphate glass (e.g., borophosphate silicate glass), etc. The dielectric structure 112 surrounds a plurality of conductive interconnect layers 114 electrically coupled to the transistor gate structures 404. In some embodiments, the plurality of conductive interconnect layers 114 may comprise one or more of copper, aluminum, tungsten, and carbon nanotubes, for example. In some embodiments, the dielectric structure 112 is coupled to a carrier substrate 412 configured to provide structural support to the BSI-CIS integrated chip 400. In some embodiments, the carrier substrate 412 may comprise silicon.

A plurality of shallow trench isolation (STI) structures 110 are also arranged within the front-side 102a of the substrate 102. The plurality of STI structures 110 comprise one or more dielectric materials (e.g., $SiO_2$) arranged within trenches in the front-side 102a of the substrate 102. A plurality of resonant structures 128 are arranged above and spaced apart from an upper surface of the STI structures 110. The resonant structures 128 are laterally disposed on opposing sides of the photodiodes 406, and extend to the back-side 102b of the substrate 102. The resonant structures encompass DTI structures 130 extending from the back-side 102b of the substrate 102. The DTI structures are arranged within trenches within a back-side 102b of the substrate 102 and over the plurality of STI structures 110. The plurality of DTI structures 130 may comprise reflective elements 136 configured to reflect electromagnetic radiation. In some embodiments, the plurality of DTI structures 130 may respectively have a width that is smaller than a width of one of the plurality of STI structures 110.

In some embodiments, one or more isolation well regions may be arranged between the STI structures 110 and the DTI structures 130. The one or more isolation well regions may comprise deep-well regions 414 and/or cell-well regions 416 having one or more doping types that provide further isolation between adjacent pixel regions 104a-104b by way of junction isolation. The deep-well regions 414 are arranged in the substrate 102 at a location laterally aligned with the STI structures 110 and/or the DTI structures 130. The cell-well regions 416 are arranged in the substrate 102 at a location vertically between the deep-well regions 414 and the STI structures 110.

The back-side 102b of the substrate 102 has a non-planar surface comprising a plurality of protrusions 118. An anti-reflective layer 304 and a layer of dielectric material 306 are arranged along the back-side 102b of the substrate 102 and may be arranged lining the trenches within the plurality of DTI structures 130. In some embodiments, a dielectric planarization structure 410 may be arranged over the layer of dielectric material 306. The dielectric planarization structure 410 has a substantially planar upper surface 410u. In various embodiments, the dielectric planarization structure 410 may comprise one or more stacked dielectric layers 410a-410b. For example, in some embodiments, the dielectric planarization structure 410 may comprise a first dielectric layer 410a comprising a first material and a second dielectric layer 410b stacked onto the first dielectric layer 410a and comprising a second material. In some embodiments, the first material and/or the second material may comprise an oxide (e.g., $SiO_2$) or a nitride, for example.

A grid structure 420 is disposed over the dielectric planarization structure 410. The grid structure 420 comprises sidewalls that define openings overlying the pixel regions 104a-104b. In various embodiments, the grid structure 420 may comprise a metal (e.g., aluminum, cobalt, copper, silver, gold, tungsten, etc.) and/or a dielectric material (e.g., $SiO_2$, SiN, etc.).

A plurality of color filters, 422a-422b, are arranged within the openings in the grid structure 420. The plurality of color filters, 422a-422b, are respectively configured to transmit specific wavelengths of incident radiation. For example, a first color filter 422a may transmit radiation having wavelengths within a first range (e.g., corresponding to green light), while a second color filter 422b may transmit radiation having wavelengths within a second range (e.g., corresponding to red light) different than the first range, etc. A plurality of micro-lenses 424 are arranged over the plurality of color filters 422a-422b. Respective ones of the plurality of micro-lenses 424 are laterally aligned with the color filters, 422a-422b, and overlie the pixel regions 104a-104b. The plurality of micro-lenses 424 are configured to focus the incident radiation (e.g., light) towards the pixel regions 104a-104b.

FIGS. 5-14 illustrate cross-sectional views 500-1400 of some embodiments of a method of forming an image sensor integrated chip comprising a textured lateral 2D resonance structure to improve quantum efficiency (QE) and modulation transfer function (MTF) in image sensing devices.

Although the cross-sectional views 500-1400 shown in FIGS. 5-14 are described with reference to a method of forming a back-side deep trench isolation (BDTI) structure for an image sensor integrated chip, it will be appreciated that the structures shown in FIGS. 5-14 are not limited to the method of formation but rather may stand alone separate of the method. Furthermore, although the method describes the formation of a BSI image sensor, it will be appreciated that the disclosed DTI structure may also be used with front-side image (FSI) image sensors.

Figure 5:
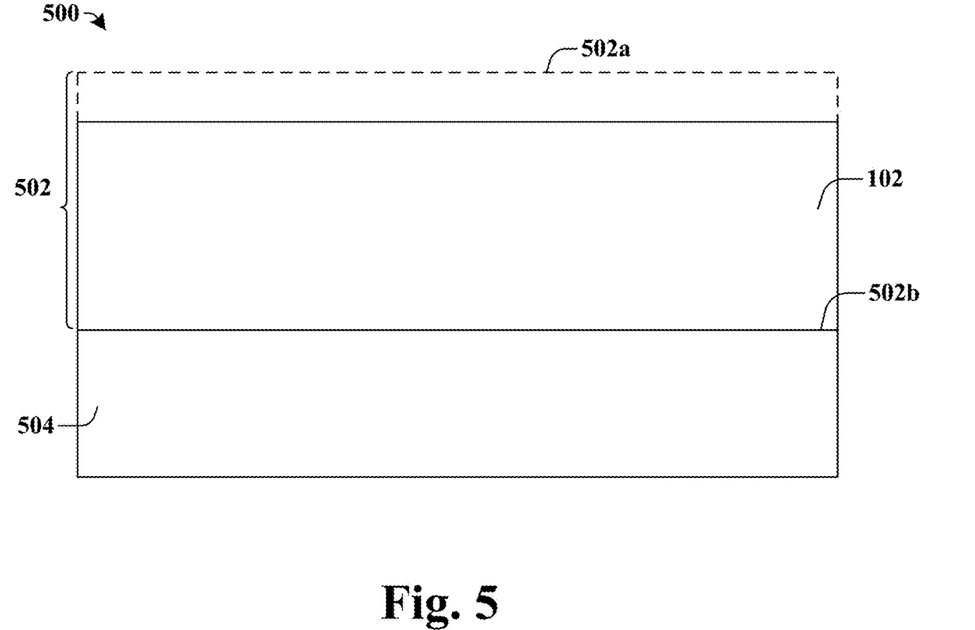
FIGS. 5-14 illustrate cross-sectional views of some embodiments of a method of forming an image sensor integrated chip having a textured lateral 2D resonance structure to improve performance.

As shown in cross-sectional view 500 of FIG. 5, a back-side 502b of a substrate 502 is bonded to a support substrate 504. The substrate 502 may be any type of semiconductor body (e.g., silicon, SiGe, SOI, etc.), as well as any other type of semiconductor and/or epitaxial layers, associated therewith. For example, in some embodiments, the substrate 502 may comprise a base substrate and an epitaxial layer. In some embodiments, the substrate 502 may comprise a silicon substrate. In some embodiments, the substrate 502 may be thinned after bonding to form a substrate 102. Thinning the substrate 502 allows for radiation to pass more easily to an image sensing element subsequently formed within the substrate 102. In various embodiments, the support substrate 502 may be thinned by etching and/or mechanical grinding a front-side 502a of the substrate 502.

Figure 6:
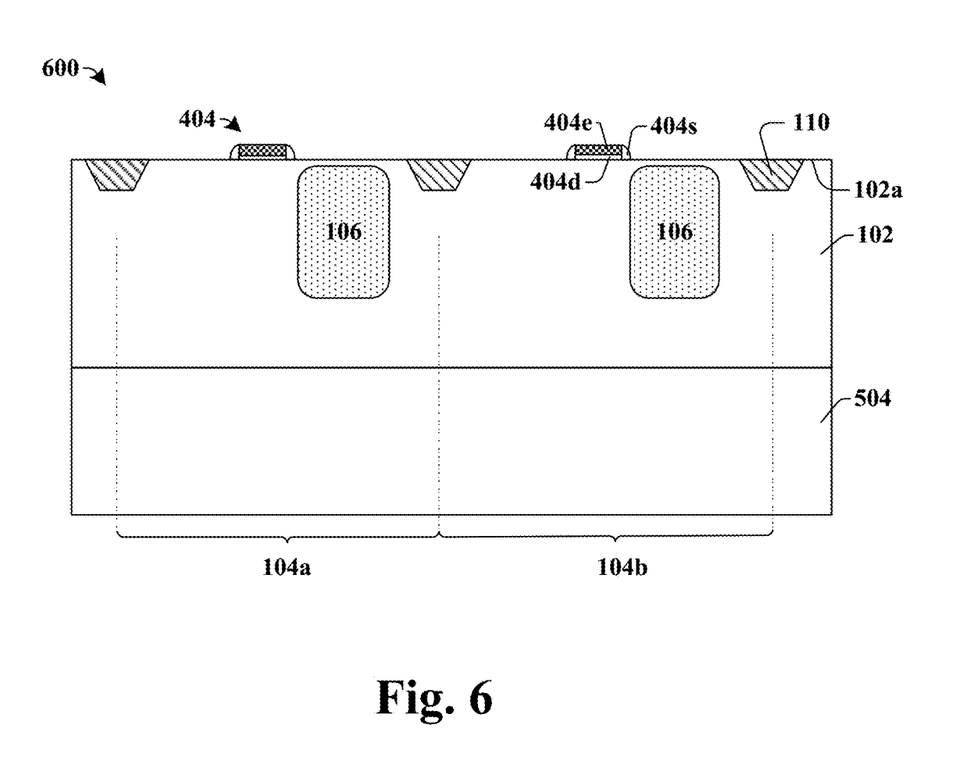

As shown in cross-sectional view 600 of FIG. 6, image sensing element 106 is formed within pixel regions 104a-104b of the substrate 102. In some embodiments, the image sensing element 106 may comprise photodiodes formed by implanting one or more dopant species into a front-side 102a of the substrate 102. For example, the photodiodes may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes.

One or more transistor gate structures 404 are formed along the front-side 102a of the substrate 102 within the pixel regions 104a-104b. In various embodiments, the one or more transistor gate structures 404 may correspond to a transfer transistor, a source-follower transistor, a row select transistor, and/or a reset transistor. In some embodiments, the one or more transistor gate structures 404 may be formed by depositing a gate dielectric film and a gate electrode film on the front-side 102a of the substrate 102. The gate dielectric film and the gate electrode film are subsequently patterned to form a gate dielectric layer 404d and a gate electrode 404e. Sidewall spacers 404s may be formed on the outer sidewalls of the gate electrode 404e. In some embodiments, the sidewall spacers 404s may be formed by depositing a spacer layer (e.g., a nitride, an oxide, etc.) onto the front-side 102a of the substrate 102 and selectively etching the spacer layer to form the sidewall spacers 404s.

In some embodiments, one or more shallow trench isolation (STI) structures 110 may be formed within the front-side 102a of the substrate 102 on opposing sides of the pixel regions 104a-104b. The STI structures 110 may be formed by selectively etching the front-side 102a of the substrate 102 to form shallow trenches and subsequently forming one or more dielectric materials within the shallow trenches. In some embodiments, the STI structures 110 may be formed prior to formation of the one or more transistor gate structures 404 and/or the image sensing element 106.

Figure 7:
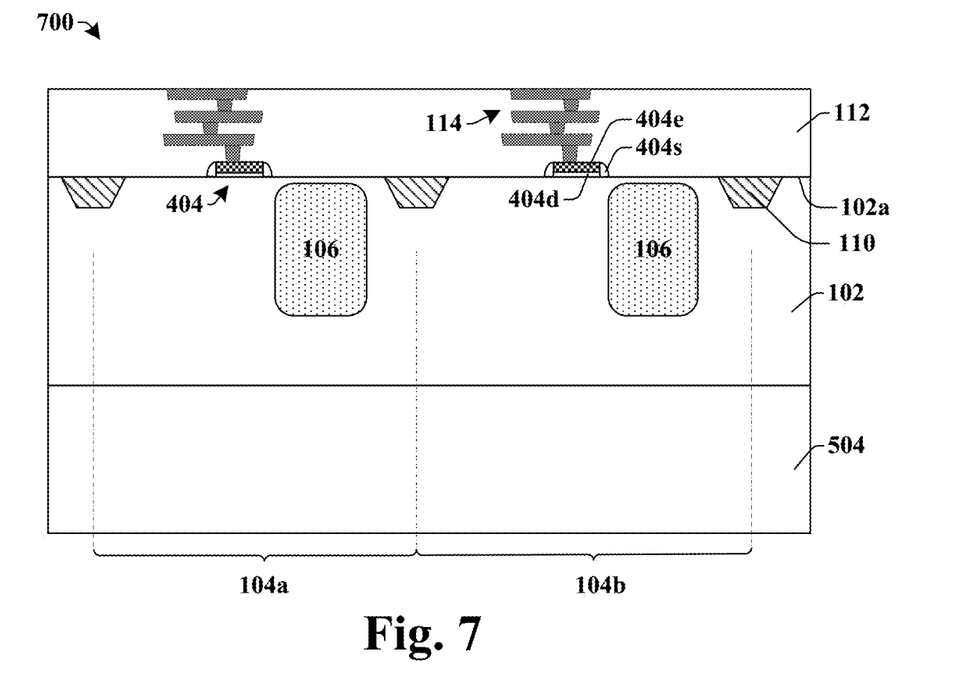

As shown in cross-sectional view 700 of FIG. 7, a plurality of conductive interconnect layers 114 are formed within a dielectric structure 112 formed along the front-side 102a of the substrate 102. The dielectric structure 112 comprises a plurality of stacked ILD layers, while the plurality of conductive interconnect layers 114 comprise alternating layers of conductive wires and vias. In some embodiments, one or more of the plurality of conductive interconnect layers 114 may be formed using a damascene process (e.g., a single damascene process or a dual damascene process). The damascene process is performed by forming an ILD layer over the front-side 102a of the substrate 102, etching the ILD layer to form a via hole and/or a metal trench, and filling the via hole and/or metal trench with a conductive material. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electroless plating, etc.). In various embodiments, the plurality of conductive interconnect layers 114 may comprise tungsten, copper, or aluminum copper, for example. In some embodiments, the support substrate 504 may be removed after forming the dielectric structure 112 along the front-side 102a of the substrate 102.

Figure 8:
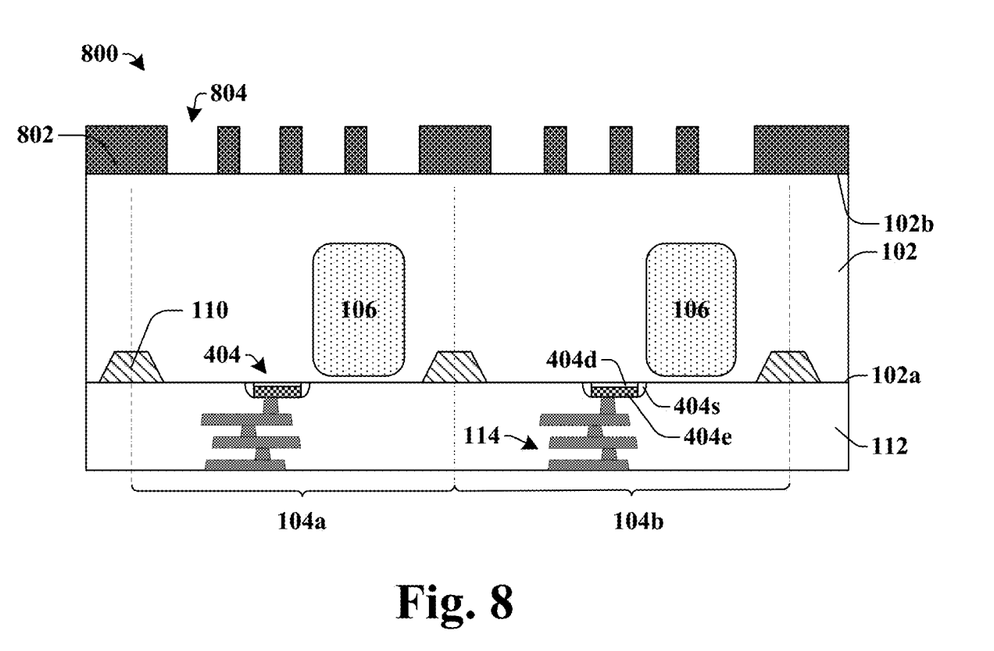

As shown in cross-sectional view 800 of FIG. 8, the part as fabricated through FIG. 7 is first flipped about the horizontal axis, and the support substrate 504 is removed. A first patterned masking layer 802 is formed along the back-side 102b of the substrate 102. The first patterned masking layer 802 comprises sidewalls defining openings 804 along the back-side 102b of the substrate 102. In some embodiments, the first patterned masking layer 802 may be formed by depositing a layer of photosensitive material (e.g., a positive or negative photoresist) along the back-side 102b of the substrate 102. The layer of photosensitive material is selectively exposed to electromagnetic radiation according to a photomask. The electromagnetic radiation modifies a solubility of exposed regions within the photosensitive material to define soluble regions. The photosensitive material is subsequently developed to define the openings 804 within the photosensitive material by removing the soluble regions.

Figure 9:
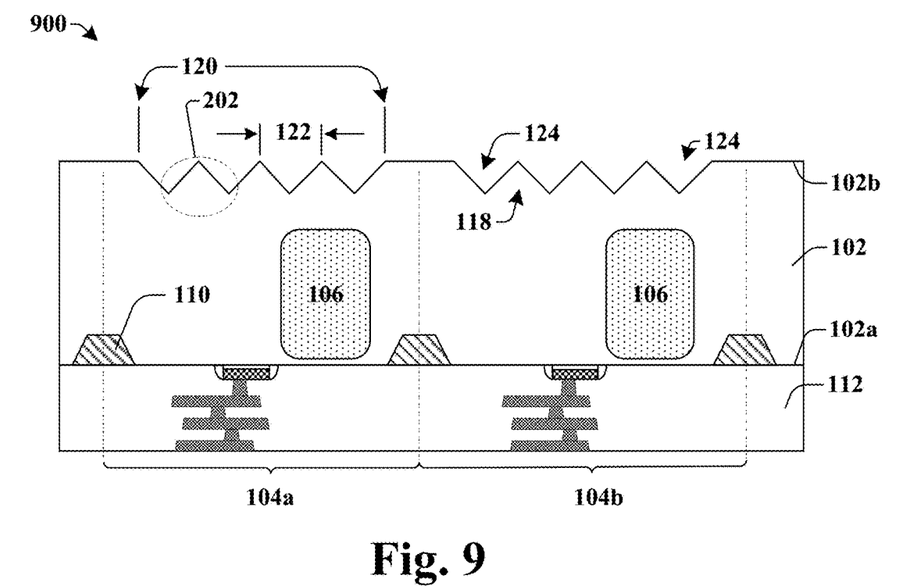

As shown in cross-sectional view 900 of FIG. 9, a first etching process is performed on the back-side 102b of the substrate 102 according to the first patterned masking layer 802 of FIG. 8. The first etching process is performed by exposing the substrate 102 to one or more etchants with the first patterned masking layer 802 in place. The one or more etchants remove parts of the substrate 102 to define a plurality of recesses 124 arranged between a plurality of protrusions 118 extending outward from the substrate 102. The plurality of protrusions 118 form a repeating periodic pattern of shapes of individual protrusions 202, and have an outer border 120 confined within the projected area of the pixel region 104a. In some embodiments, the first etching process may comprise a dry etching process. For example, the first etching process may comprise a coupled plasma etching process, such as an inductively coupled plasma (ICP) etching process or a capacitively coupled plasma (CCP) etching process. In other embodiments, the first etching process may comprise a wet etching process.

The repeating shapes of the individual protrusions 202 give rise to a characteristic dimension 122 of the plurality of protrusions 118. In some embodiments, the characteristic dimension 122 is a spacing between repeating features among the individual protrusions 202. In some embodiments, the characteristic dimension 122 comprises a pitch distance 122a defined by the spacing between nearest peaks of the individual protrusions 202.

Figure 10:
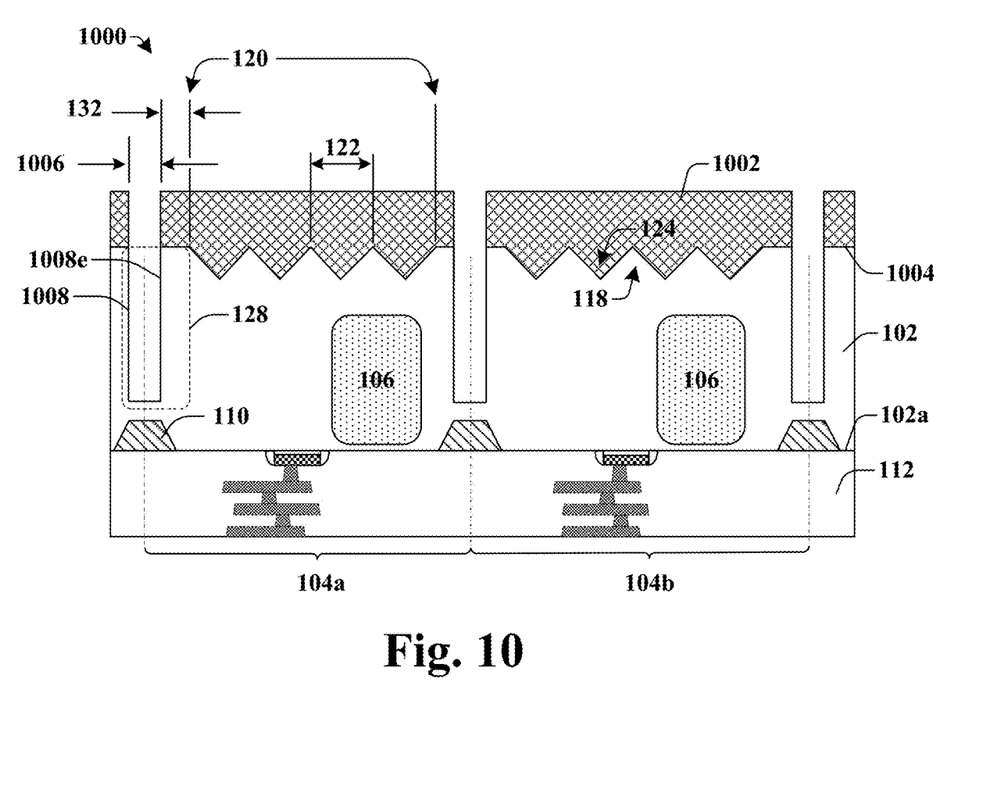

As shown in cross-sectional view 1000 of FIG. 10, a second etching process is performed on the back-side 102b of the substrate 102 according to a second patterned masking layer 1002. The second etching process defines the location for the trenches 1008 which are contained within the resonance structure 128, and which will subsequently accommodate the DTI structures 130. The trenches 1008 have a nominal width 1006, and the inner surface 1008e of the trenches 1008 is located at a reflective length 132 measured laterally from the outer border 120 of the plurality of protrusions 118. The reflective length 132 is preferentially determined based on the characteristic dimension 122 of the plurality of protrusions 118 in order to affect cohesive reflection of radiation toward the image sensor element 106. In some embodiments, the reflective length 132 may be less than or equal to about three (3) times the characteristic dimension 122. In some embodiments, the reflective length is less than or equal to about $3\sqrt{2}/2$ multiplied by the characteristic dimension 122.

In some embodiments, the trenches 1008 may be arranged within horizontally extending surfaces 1004 of the substrate 102. The second etching process is performed by exposing unmasked regions of the substrate 102 to one or more etchants, which remove parts of the substrate 102 in the unmasked regions to define trenches 1008 for the DTI structures 130. In some embodiments, the trenches 1008 comprise tapered sidewalls that cause a width of the trenches to respectively decrease as a distance from the back-side 102b of the substrate 102 increases.

Figure 11:
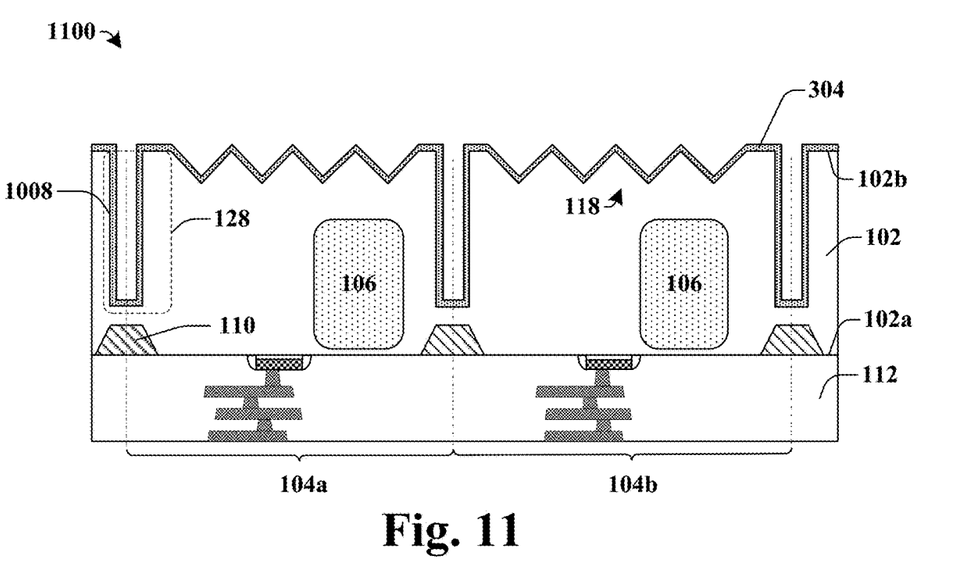

As shown in cross-sectional view 1100 of FIG. 11, the second patterned masking layer 1002 is stripped and an anti-reflective layer 304 may be formed along the back-side 102b of the substrate 102. The anti-reflective layer 304 lines the back-side 102b of the substrate 102. In some embodiments, the anti-reflective layer 304 may further line interior surfaces of the trenches 1008. In some embodiments, the anti-reflective layer 304 may comprise a high-k dielectric layer including hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), etc. In some embodiments, the anti-reflective layer 304 may be deposited by a physical vapor deposition technique (e.g., PVD, CVD, PE-CVD, ALD, etc.).

Figure 12:
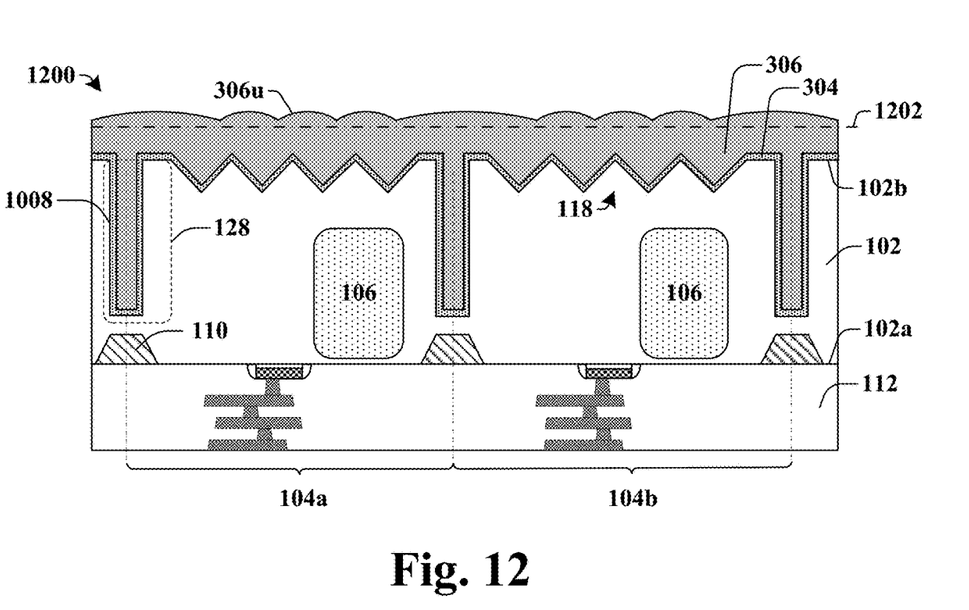

As shown in cross-sectional view 1200 of FIG. 12, a layer of dielectric material 306 is formed over the anti-reflective layer 304, such that the anti-reflective layer 304 separates the dielectric material 306 from the substrate 102. In various embodiments, the layer of dielectric material 306 may comprise an oxide (e.g., silicon oxide), TEOS, etc. In some embodiments, the layer of dielectric material 306 may extend between adjacent ones of the plurality of protrusions 118 and fill the trenches 1008. The layer of dielectric material 306 may be deposited to have an upper surface 306u comprising a plurality of curved surfaces arranged over the plurality of protrusions 118 and intersecting one another. In some embodiments, the plurality of curved surfaces may be removed by a subsequent planarization process (e.g., a chemical mechanical planarization process) to form a substantially planar surface along line 1202.

Figure 13:
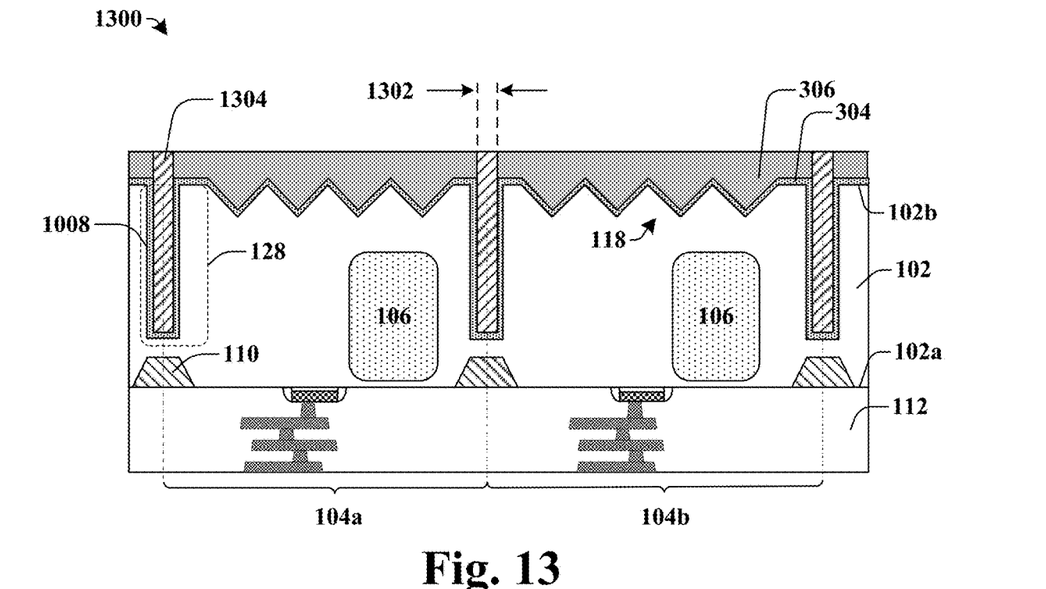

As shown in cross-sectional view 1300 of FIG. 13, a third etching process is performed to remove the layer of dielectric material 306 from within the trenches 1008. The removal of the layer of dielectric material 306 from within the trenches 1008 results in cavities 1302 within the trenches 1008. The cavities 1302 may be subsequently filled with one or more reflective filler materials 1304. In various embodiments, the one or more reflective filler materials 1304 may comprise aluminum (Al), rhodium (Rh), ruthenium (Ru), copper (Cu), silver (Ag), gold (Au), tungsten (W), cobalt (Co), iron (Fe), molybdenum (Mo), titanium (Ti), chromium (Cr).

In some embodiments, the one or more reflective filler materials 1304 may not fill an entirety of the cavities 1302, resulting in cavities respectively comprising one or more reflective regions including the one or more reflective filler materials 1304 and a reflective region including an air gap (not shown). For example, in some embodiments, the trenches 1008 may have curved sidewalls (not shown) that define an opening along back-side 102b of the substrate 102, which has a smaller width that an underlying region of the cavities 1302. When the one or more reflective filler materials 1304 are deposited into the cavities 1302, the one or more reflective filler materials 1304 may close the opening prior to filling an entirety of the cavities 1302, resulting in an air gap (not shown) within the trenches 1008.

Figure 14:
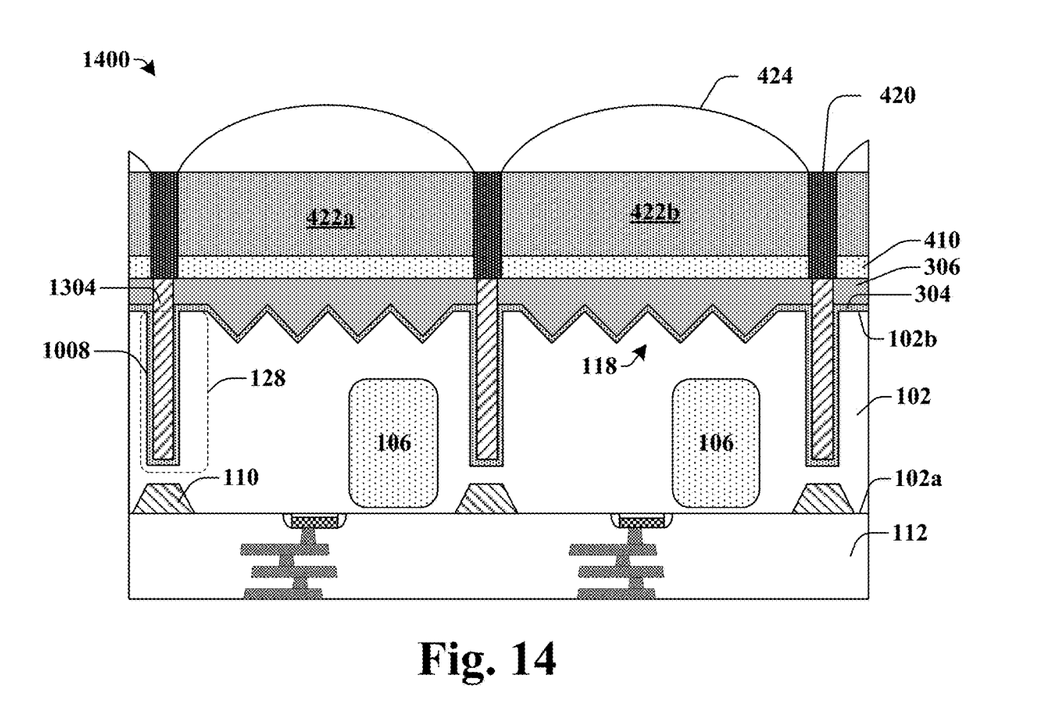

As shown in cross-sectional view 1400 of FIG. 14, a plurality of color filters 422a-422b are formed over the layer of dielectric material 306. In some embodiments, a dielectric planarization structure 410 may be arranged over the layer of dielectric material 306, and the color filters 422a-422b may be formed over the dielectric planarization structure 410. In some embodiments, the plurality of color filters 422a-422b may be formed within openings in a grid structure 420 overlying the layer of dielectric material 306. In some embodiments, the plurality of color filters 422a-422b may be formed by forming a color filter layer and patterning the color filter layer. The color filter layer is formed of a material that allows for the transmission of radiation (e.g., light) having a specific range of wavelength, while blocking light of wavelengths outside of the specified range.

A plurality of micro-lenses 424 are formed over the plurality of color filters 422a-422b. In some embodiments, the plurality of micro-lenses 424 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 424 are then formed by selectively etching the micro-lens material according to the micro-lens template. In this manner, an improved image sensor chip is provided featuring a lateral resonance structure including a deep trench isolation (DTI) structure. The DTI structure is configured, in consideration of the pattern of the plurality of protrusions, to improve quantum efficiency (QE) and modulation transfer function (MTF) of the image sensor.

Figure 15:
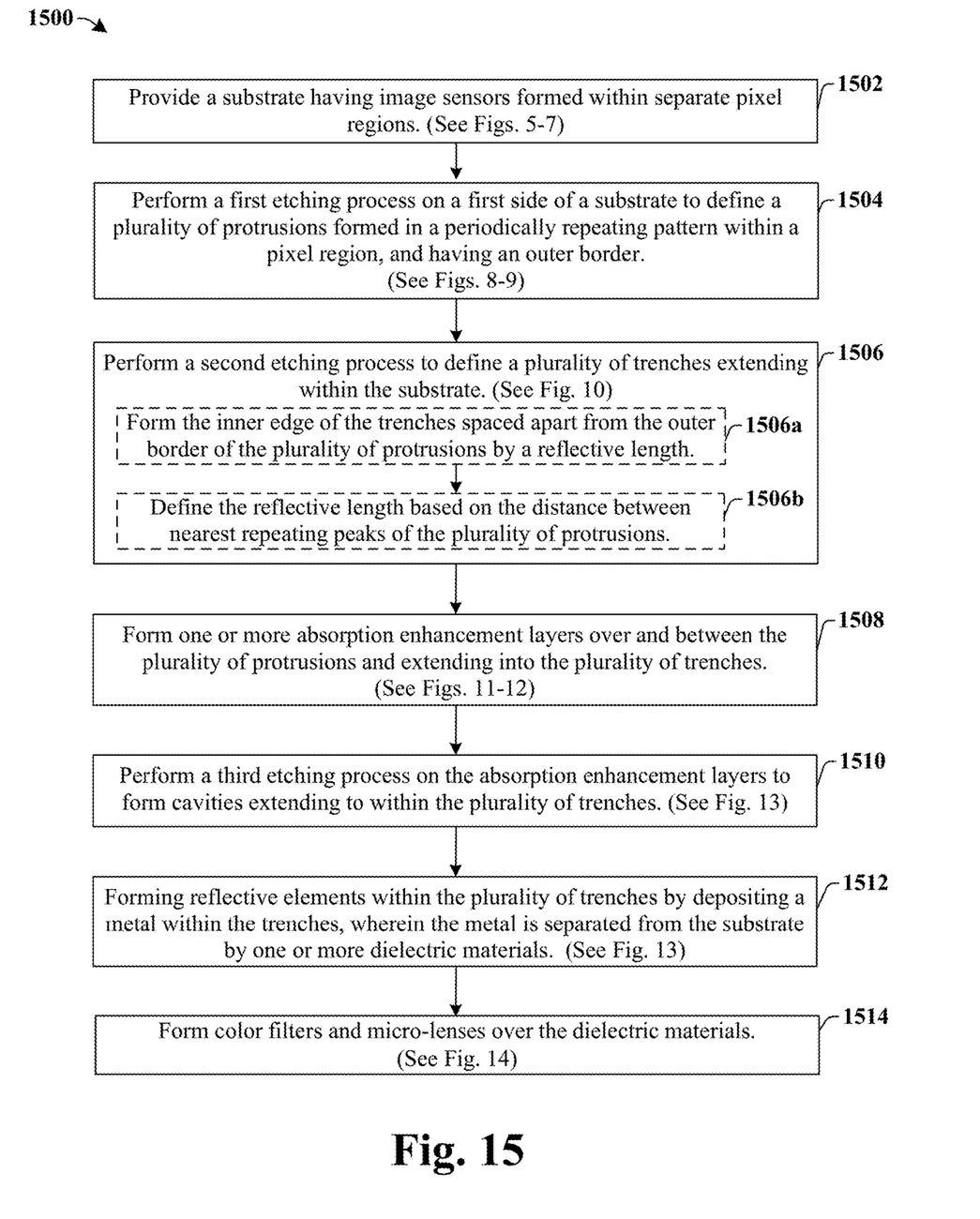
FIG. 15 illustrates a flow diagram of some embodiments of a method of forming an image sensor integrated chip having a textured lateral 2D resonance structure to improve performance.

FIG. 15 illustrates a flow diagram of some embodiments of a method 1500 of forming an image sensor integrated chip having a textured lateral 2D resonance structure to improve image sensing.

While method 1500 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, a substrate is provided having image sensors formed within separate pixel regions. FIGS. 5-7 illustrate cross-sectional views 500 through 700 of some embodiments corresponding to act 1502.

At 1504, a first etching process is performed on a first side of a substrate to define a plurality of protrusions formed in a periodically repeating pattern within a pixel region, and having an outer border. FIGS. 8-9 illustrate cross-sectional views 800 and 900 of some embodiments corresponding to act 1504.

At 1506, a second etching process is performed to define a plurality of trenches extending within the substrate. At sub-step 1506a, the inner surface of the trenches are formed spaced apart from the outer border of the plurality of protrusions by a reflective length. At sub-step 1506b, the reflective length is defined based on the distance between nearest repeating peaks of the plurality of protrusions. FIG. 10 illustrates cross-sectional view 1000 of some embodiments corresponding to act 1506.

At 1508, one or more absorption enhancement layers are formed over and between the plurality of protrusions and extending into the plurality of trenches. FIGS. 11-12 illustrate cross-sectional views 1100 and 1200 of some embodiments corresponding to act 1508.

At 1510, a third etching process is performed on the absorption enhancement layers to form cavities extending to within the plurality of trenches. FIG. 13 illustrates cross-sectional view 1300 of some embodiments corresponding to act 1510.

At 1512, reflective elements are formed within the plurality of trenches by depositing a metal within the trenches, wherein the metal is separated from the substrate by one or more dielectric materials. FIG. 13 illustrates cross-sectional view 1300 of some embodiments corresponding to act 1512.

At 1514, color filters and micro-lenses are formed over the dielectric materials. FIG. 14 illustrates cross-sectional view 1400 of some embodiments corresponding to act 1514.

Accordingly, the present disclosure relates to an image sensor integrated chip having a textured lateral 2D resonance structure to improve quantum efficiency (QE) and modulation transfer function (MTF), and an associated method of formation.

Some embodiments of the present disclosure relate to a semiconductor device configured to detect electromagnetic radiation. An image sensing element is arranged within a substrate. A radiation absorption region includes an array of protrusions arranged along a first side of the substrate over the image sensing element. The array of protrusions have a characteristic dimension and an outer border. A deep trench isolation (DTI) structure surrounds the outer border of the array of protrusions. The DTI structure extends from the first side of the substrate to within the substrate. An inner surface of the DTI structure is laterally spaced apart from the outer border of the array of protrusions by a reflective length that is based on the characteristic dimension of the array of protrusions.

In other embodiments, the present disclosure relates to a semiconductor device. The semiconductor device includes a semiconductor substrate, and a plurality of ring-shaped deep trench isolation (DTI) structures extending from a first side of the substrate to within the substrate. A plurality of image sensing elements are disposed within the semiconductor substrate and are disposed within the plurality of ring-shaped DTI structures, respectively, such that the ring-shaped DTI structures separate adjacent image sensing elements from one another. A plurality of protrusions are arranged along the first side of the substrate. The plurality of protrusions are disposed over an image sensing element and are laterally surrounded by a ring-shaped DTI structure. The plurality of protrusions are periodically spaced and are substantially identical to one another and have a characteristic dimension. An innermost surface of the ring-shaped DTI structure is spaced apart from an outer border of the plurality of protrusions by a predetermined reflective length that is based on the characteristic dimension of the plurality of protrusions.

In still other embodiments, the present disclosure relates to a method of forming a semiconductor device. In this method, a substrate, which has image sensors formed therein, is provided. The image sensors are formed within separate pixel regions. A first etching process is performed on a first side of the substrate to define a plurality of protrusions formed in a periodically repeating pattern within the pixel region. The plurality of protrusions have sides and peaks and are pyramidal or cone shaped, and have an outer border. A second etching process is performed on the first side of the substrate to define a plurality of trenches extending within the substrate. An inner surface of the plurality of trenches is laterally spaced apart from the outer border by a reflective length based on a distance between nearest repeating peaks of the plurality of protrusions. One or more absorption enhancement layers are formed over and between the plurality of protrusions and extend into the plurality of trenches. A third etching process is performed on the one or more absorption enhancement layers to form cavities extending to within the plurality of trenches. Reflective elements are formed within the cavities by depositing a metal. The metal is separated from the substrate by one or more dielectric materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device that detects electromagnetic radiation, comprising:
   an image sensing element arranged within a substrate;
   a radiation absorption region comprising an array of protrusions arranged along a first side of the substrate over the image sensing element, the array of protrusions having a characteristic dimension and an outer border; and
   a deep trench isolation (DTI) structure surrounding the outer border of the array of protrusions, the DTI structure extending from the first side of the substrate to within the substrate, wherein an inner surface of the DTI structure is laterally spaced apart from the outer border of the array of protrusions by a reflective length defined by a continuous flat region of the substrate, the continuous flat region being level with an upper surface of the array of protrusions, wherein the reflective length is based on the characteristic dimension of the array of protrusions;
   a reflective element disposed within the DTI structure, the reflective element configured to reflect a wavelength of electromagnetic radiation toward the image sensing element; and
   an absorption enhancement layer arranged and in continuous contact with the upper surface of the array of protrusions, the continuous flat region, and the reflective element,
   wherein the reflective element has a top surface that is level with a top surface of the absorption enhancement layer.

2. The semiconductor device of claim 1, wherein the array of protrusions comprises a periodically repeating pattern of individual protrusions, the individual protrusions comprising a conical or pyramidal shape with sides and a peak.

3. The semiconductor device of claim 2, wherein the sides of the conical or pyramidal shape are substantially planar, convex, or concave.

4. The semiconductor device of claim 3, wherein the characteristic dimension comprises a pitch distance defined by a spacing between nearest peaks of the individual protrusions.

5. The semiconductor device of claim 4, wherein the reflective length is approximately equal to $(3 \times \sqrt{2}/2)$ times the pitch distance.

6. The semiconductor device of claim 1, wherein the reflective element is arranged within a central portion of the DTI structure.

7. The semiconductor device of claim 6, further comprising one or more additional absorption enhancement layers arranged over and between the array of protrusions.

8. The semiconductor device of claim 7, wherein the one or more additional absorption enhancement layers comprise:
   an anti-reflective layer; and
   a layer of dielectric material separated from the substrate by the anti-reflective layer.

9. The semiconductor device of claim 8, wherein the anti-reflective layer and the layer of dielectric material laterally separate the reflective element from the substrate.

10. A semiconductor device, comprising:
   a semiconductor substrate;
   a plurality of ring-shaped deep trench isolation (DTI) structures extending from a first side of the semiconductor substrate to within the semiconductor substrate;
   a plurality of image sensing elements disposed within the semiconductor substrate and disposed within the plurality of ring-shaped DTI structures, respectively, such that a ring-shaped DTI structure separates adjacent image sensing elements from one another;
   a reflective element disposed within the ring-shaped DTI structure, the reflective element configured to reflect a wavelength of electromagnetic radiation toward the image sensing element;
   a plurality of protrusions arranged along the first side of the semiconductor substrate, the plurality of protrusions being disposed over an image sensing element and being laterally surrounded by the ring-shaped DTI structure, the plurality of protrusions being periodically spaced and being substantially identical to one another and having a characteristic dimension;
   an anti-reflective layer comprising no more than one material disposed within the ring-shaped DTI structure and over the plurality of protrusions;
   wherein an innermost surface of the ring-shaped DTI structure is spaced apart from an outer border of the plurality of protrusions by a predetermined reflective length that is based on the characteristic dimension of the plurality of protrusions, and
   wherein the anti-reflective layer directly contacts an upper surface of the plurality of protrusions, an outer surface of the reflective element, an inner surface of the reflective element, a bottom surface of the reflective element, and the semiconductor substrate.

11. The semiconductor device of claim 10, wherein the plurality of protrusions have a substantially pyramidal or cone shape with sides and a peak.

12. The semiconductor device of claim 11, wherein the plurality of protrusions comprises individual protrusions, and the characteristic dimension comprises a pitch distance defined by a spacing between nearest peaks of individual protrusions.

13. The semiconductor device of claim 12, wherein the predetermined reflective length is less than or equal to about three times the pitch distance.

14. The semiconductor device of claim 13, wherein the predetermined reflective length is less than or equal to about $(3 \times \sqrt{2}/2) \times$ the pitch distance.

15. A semiconductor device, comprising:
a semiconductor substrate;
a plurality of ring-shaped deep trench isolation (DTI) structures extending from a first side of the semiconductor substrate to within the semiconductor substrate;
a plurality of ring-shaped shallow trench isolation (STI) structures extending from a second side of the semiconductor substrate to within the semiconductor substrate, with an uppermost surface being generally aligned under a bottommost surface of the plurality of ring-shaped DTI structures, the second side being opposite the first side;
a plurality of image sensing elements disposed within the semiconductor substrate and laterally surrounded by the plurality of ring-shaped DTI structures, respective, and laterally surrounded by the plurality of ring-shaped STI structures, respectively, such that a ring-shaped DTI structure and a ring-shaped STI structure laterally separate an image sensing element from an adjacent image sensing element;
a plurality of protrusions arranged along the first side of the semiconductor substrate, the plurality of protrusions being disposed over the image sensing element and being laterally surrounded by the ring-shaped DTI structure, the plurality of protrusions being periodically spaced and being substantially identical to one another and having a characteristic dimension; and
wherein an innermost surface of the ring-shaped DTI structure is spaced apart from an outer border of the plurality of protrusions by a predetermined reflective length that is based on the characteristic dimension of the plurality of protrusions.

16. The semiconductor device of claim 15, further comprising:
an anti-reflective layer disposed over the semiconductor substrate and conformally covering peaks and valleys of the plurality of protrusions; and
a layer of dielectric material disposed over the semiconductor substrate and separated from the semiconductor substrate by the anti-reflective layer;
wherein the ring-shaped DTI structure comprises a reflective element, and wherein the anti-reflective layer extends downward from the protrusions to cover sidewalls of the reflective element and to cover a lower surface of the reflective element.

17. The semiconductor device of claim 6, wherein a ring-shaped shallow trench isolation (STI) structure extends from a second side of the substrate to within the substrate with an uppermost surface generally aligned under a bottommost surface of the DTI structure, the second side being opposite the first side.

18. The semiconductor device of claim 10, wherein the predetermined reflective length is defined by a continuous flat region, level with a top edge of the plurality of protrusions; and
an absorption enhancement layer arranged over and in continuous contact with the upper surface of the plurality of protrusions and an upper surface of the plurality of ring-shaped DTI structures; and
a plurality of ring-shaped shallow trench isolation (STI) structures extending from a second side of the semiconductor substrate to within the semiconductor substrate, with an uppermost surface being generally aligned under a bottommost surface of the plurality of ring-shaped DTI structures, the second side being opposite the first side.

19. The semiconductor device of claim 16, wherein the predetermined reflective length is defined by a continuous flat region, level with a top edge of the plurality of protrusions; and
an absorption enhancement layer arranged over and in continuous contact with the upper surface of the plurality of protrusions and upper surface of the plurality of ring-shaped DTI structures.

20. The semiconductor device of claim 10, further comprising one or more absorption enhancement layers disposed in direct contact with an uppermost surface of the anti-reflective layer.

* * * * *